United States Patent
Tohda

[11] Patent Number: 6,046,114
[45] Date of Patent: Apr. 4, 2000

[54] METHOD FOR PRODUCING A SEMICONDUCTOR DEVICE

[75] Inventor: Toshiyuki Tohda, Higashiosaka, Japan

[73] Assignee: Sharp Kabushiki Kaisha, Osaka, Japan

[21] Appl. No.: 09/028,488

[22] Filed: Feb. 24, 1998

[30] Foreign Application Priority Data

Feb. 26, 1997 [JP] Japan .................................. 9-041798

[51] Int. Cl.⁷ ................................................ H01L 21/311
[52] U.S. Cl. ........................ 438/695; 438/715; 438/717; 438/725; 216/41; 216/46; 216/67
[58] Field of Search ................................. 216/2, 17, 41, 216/47, 49, 64, 67, 72; 438/696, 710, 715, 717, 725, 728

[56] References Cited

U.S. PATENT DOCUMENTS 5,759,755  6/1998  Park et al. ............................. 430/512

FOREIGN PATENT DOCUMENTS 07307328  11/1995  Japan .
410242117A  9/1998  Japan .......................... H01L 21/3065

*Primary Examiner*—Randy Gulakowski
*Assistant Examiner*—Allan Olsen
*Attorney, Agent, or Firm*—Nixon & Vanderhye P.C.

[57] ABSTRACT

A method for producing a semiconductor device comprises forming a film to be etched, an organic antireflective film and a resist mask on a substrate in this order; and before etching the film to be etched, dry-etching the organic antireflective film into a predetermined configuration by use of the resist mask and an etching gas containing chlorine atom and oxygen atom with maintaining the substrate at such a temperature that allows deposition of a substance produced by reaction of the organic antireflective film with chlorine atom contained in the etching gas.

6 Claims, 5 Drawing Sheets

METHOD FOR PRODUCING A SEMICONDUCTOR DEVICE

CROSS-REFERENCE TO RELATED APPLICATIONS

This application is related to Japanese applications No. Hei 9(1997)-41798, filed on Feb. 26, 1997 whose priority is claimed under 35 USC § 119, the disclosure of which is incorporated by reference in its entirety.

BACKGROUND OF THE INVENTION

1. Field of the Invention

The present invention relates to a method for producing semiconductor devices, more particularly to a dry etching method for organic antireflective coatings (ARC).

2. Description of Related Art

With remarkable reduction of the size of semiconductor devices in recent years, deformations and other defects in a fine resist pattern sometimes appear in a process of forming the fine resist pattern on a semiconductor substrate by photolithography due to reflection from an underlayer in the case where the underlayer under a photo-resist layer has steps or includes two or more kinds of films having different reflection factors. In order to cope with such phenomenon, an ARC is formed under the photoresist layer to appropriately control light reflected from the underlayer and thereby prevent defects in the pattern after a photolithography. After being formed, the ARC is usually patterned by a dry etching method using the fine resist pattern as a mask. However, conventional dry etching method is disadvantageous in some respects.

The conventional dry etching method for the ARC is now explained with reference to FIGS. 6(a) to 6(b).

As shown in FIG. 6(a), first, a film to be etched 22, an ARC 23 and a resist pattern 24 are formed on a silicon substrate 21. The ARC 23 is then etched with an etching gas of a mixture of a halogenated hydrocarbon containing fluorine (e.g., $CHF_3$, $CF_4$) and oxygen by use of the resist pattern 24 as a mask.

With the above step, however, it is difficult to maintain the width of lines of the resist pattern 24, i.e., it is difficult to control the amount of deposition on side wall of the resist pattern 24. Since the deposits are mainly generated by decomposition of the halogenated hydrocarbon, etching shift appear depending greatly on how dense the resist pattern 24 is. The amount of deposits from the halogenated hydrocarbon on the side walls of the resist pattern 24 becomes larger as the resist pattern 24 is less dense. Therefore the width of lines of the resist pattern 24 after etching tends to be larger in a less densely designed part 24 than in a more densely designed part 26 (see FIG. 6(b)).

Further, since the etching gas contains fluorine, the film to be etched 22 reduces its thickness when the ARC 23 is over-etched in the case where the film to be etched 22 is made of a silicon compound (see FIG. 6(c)). This has disadvantageous effect on the control of subsequent steps and also makes reworking for formation of the resist pattern 24 or ARC 23 difficult.

In other words, if the film to be etched 22 is over-etched during etching of the ARC 23, the film 22 becomes thin and thereby it becomes difficult to detect the etching end point of the film 22 in the later etching of the film 22 by use of the ARC as the mask. Besides, since the deposits accumulate on side walls of steps, there is a disadvantage in that the amount of etching shift greatly increases.

In order to cope with the great dependence of etching shift on the density of the resist pattern, a method has been proposed in which argon and oxygen are used as the etching gas. This method diminishes the dependence of etching shift on the density of the resist pattern. However, deposits are not generated on the side walls of the resist pattern, and therefore the width of lines of the resist pattern is greatly reduced both in the less densely designed part and in the more densely designed part.

SUMMARY OF THE INVENTION

The present invention provides a method for producing a semiconductor device comprising forming a film to be etched, an organic antireflective film and a resist mask on a substrate in this order, and before etching the film to be etched dry-etching the organic antireflective film into a predetermined configuration by use of the resist mask and an etching gas containing chlorine atom and oxygen atom with maintaining the substrate at such a temperature that allows a substance produced by reaction of the organic antireflective film with chlorine atom contained in the etching gas to be deposited.

DESCRIPTION OF THE PREFERRED EMBODIMENTS

Figure 1A:
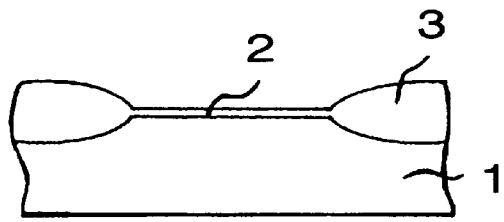
FIGS. 1(a) to 1(h) illustrate a process for producing a semiconductor device in accordance with an embodiment of the present invention.

Accordingly to the present invention, the substrate may be any one on which a semiconductor device is usually formed and therefore is not particularly limited. Examples thereof include substrates of semiconductors such as silicon and germanium and of compound semiconductors such as GaAs, InGaAs and the like, among which a silicon substrate is preferred. The substrate may be the one on which nothing is mounted and the one on which an insulation film is mounted or on which devices such as a transistor, a capacitor and the like, a wire, an insulation film and the like are mounted.

The film to be etched may be any one of electrically conductive films such as an electrode and a wiring layer which compose a device such as a transistor and a capacitor and insulation films having various thicknesses. For example, materials for the films to be etched include polysilicon, amorphous silicon, monosilicon, silicide, polycide and metals such as copper, silver, tungsten and tantalum. The thickness of the film to be etched is suitably chosen for application. In the case where the film is used as an electrode or wiring layer, the thickness thereof is generally about 200 to about 1000 Å.

Examples of the organic antireflective films include an ARC, ARL, ARF or the like. The thickness of the organic antireflective coating film is about 100 to about 10000 Å, for example.

The resist mask may any one that is generally used in a photolithography and etching method and therefore is not particularly limited. The thickness of the resist mask is preferably about 1000 to about 20000 Å in general. The resist mask is formed by applying a resist on an underlayer to be masked and patterning the resist into a desired configuration by the photolithography and etching method.

The above-mentioned organic antireflective film may be patterned into a desired configuration by dry-etching using the above-described resist mask, before etching the film to be etched.

The dry etching can be performed using the etching gas containing chlorine atom and oxygen atom with maintaining the substrate at such a temperature that allows deposition of a substance produced by reaction of the organic antireflective film and chlorine atom contained in the etching gas.

Here, the etching gas containing chlorine atom and oxygen atom may be a mixture of an chlorine gas ($Cl_2$) and an oxygen gas ($O_2$) or may contain these gases and an inert gas. In addition, the etching gas may be a mixture of a chlorine (Cl)—containing gas such as $BCl_3$ or HCl and an oxygen (O)—containing gas such as CO or $CO_2$, a mixture of the above chlorine-containing gas and the oxygen gas, or a mixture of the chlorine gas and the above-described oxygen-containing gas.

The molar ratio of chlorine atom to chlorine atom and oxygen atom in the etching gas may be chosen in consideration of other etching conditions, the amount of deposits onto side walls of the resist mask during the etching and the following.

For example, in the case where the organic antireflective film is the ARC, which contains carbon atom as a component element, oxygen atom in the etching gas reacts with carbon atom to produce CO, which sublimes. Chlorine atom in the etching gas reacts with carbon atom to produce CCl substances, which accumulate, if the temperature of the substrate is lower than a certain temperature. Thus, as the ratio of the chlorine atom in the etching gas is higher, the amount of deposits on the side walls of the resist mask is larger.

Figure 2:
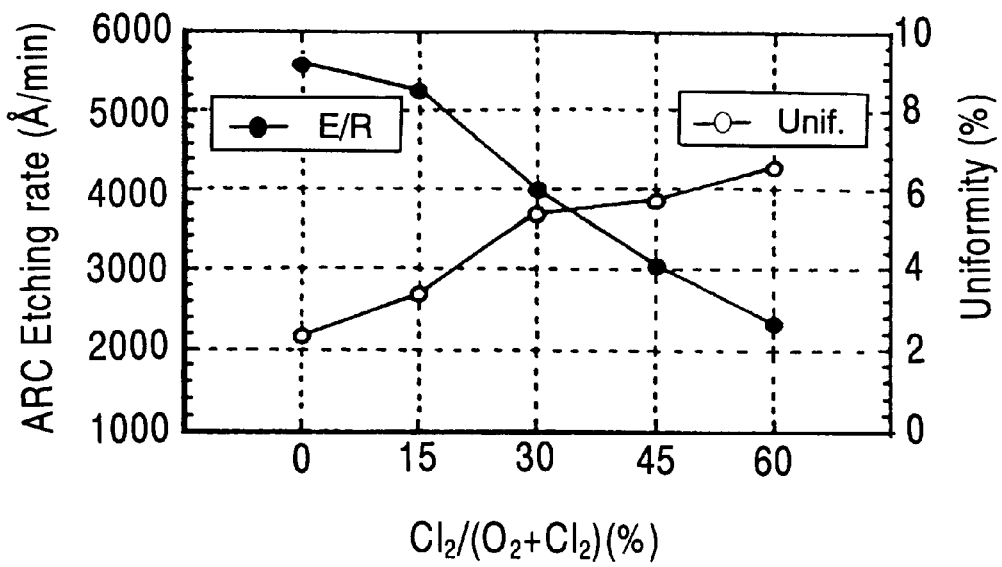
FIG. 2 is a graph illustrating the relationship between a flow rate of chlorine gas/(the flow rate of chlorine gas +oxygen gas) and an ARC etching rate as well as uniformity.
Figure 3:
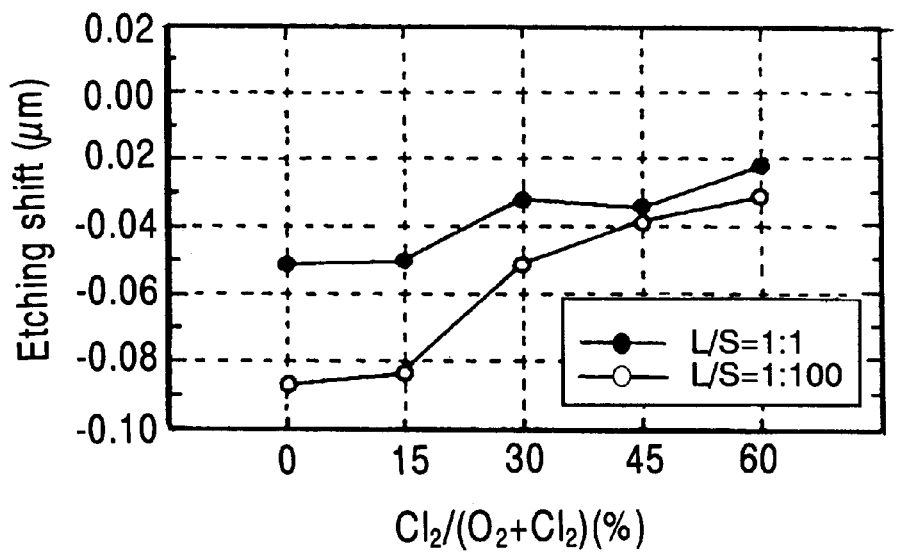
FIG. 3 is a graph illustrating the relationship between the flow rate of chlorine gas/(the flow rate of chlorine gas +oxygen gas) and an amount of etching shift.

FIG. 2 is a graph illustrating the relationship between the ratio of the flow rate of chlorine gas to the sum of the flow rates of chlorine gas and of oxygen gas ($Cl_2/Cl_2+O_2$) in the etching gas and an etching rate of the ARC as well as uniformity of the ARC in accordance with the present invention. FIG. 3 is a graph illustrating the relationship between the ratio of the flow rate of chlorine gas to the sum of the flow rates of chlorine gas and of oxygen gas and the amount of etching shift. Results shown in these figures show that as the ratio of the flow rate of chlorine gas becomes larger, the etching rate of the ARC and the uniformity thereof tend to decline and the etching shift and the dependence on the density of the pattern tend to be reduced.

Figure 4:
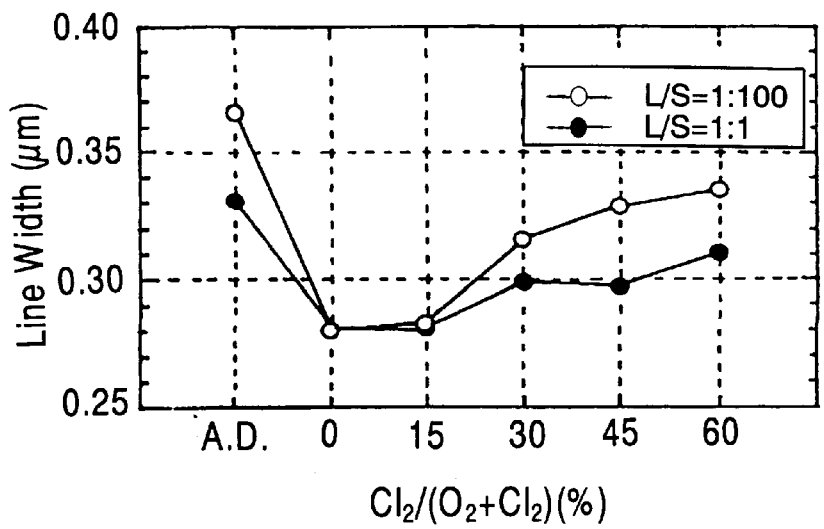
FIG. 4 is a graph illustrating the relationship between the width of lines after a photolithography and an etching method and the width of the lines of the organic antireflective film after etching with respect to the flow rate of chlorine gas/(the flow rate of chlorine gas+oxygen gas)

FIG. 4 is a graph illustrating the relationship of the width of lines of the resist mask after the photolithography and etching method and the width of lines of the organic antireflective film after the etching with respect to the ratio of the flow rate of chlorine gas to the sum of the flow rates chlorine gas and of oxygen gas of the etching gas. As the ratio of the flow rate of chlorine gas in the etching gas becomes smaller, the dependence on the density of the pattern after the photolithography and etching method declines but the amount of etching shifts more greatly. On the other hand, as the ratio of the flow rate of chlorine in the etching gas becomes larger, the etching is carried out with smaller etching shift and less dependence on the density of the pattern.

In FIGS. 2 to 4, the etching gas contains chlorine gas and oxygen gas. The flow rate of the etching gas has about 60 sccm as a whole, and the flow rate of chlorine gas is 0 to about 36 sccm, the flow rate of oxygen gas is about 60 to about 24 sccm. In other words, the molar ratio in the etching gas of chlorine atom to chlorine atom and oxygen atom is 0 to about 0.6.

Taking FIGS. 2 to 4 into consideration, the ratio of the flow rate of chlorine gas to the sum of the flow rate of chlorine gas and oxygen gas is preferably about 30% or more by volume. In other words, the molar ratio of chlorine atom to chlorine atom and oxygen atom in the etching gas is preferably about 0.3 or more, more preferably about 0.45 or more and about 0.8 or less. The above explanation of the molar ratio is given about chlorine gas ($Cl_2$) and oxygen gas ($O_2$), but the same explanation can be given about chlorine- and oxygen-containing gases.

Figure 5:
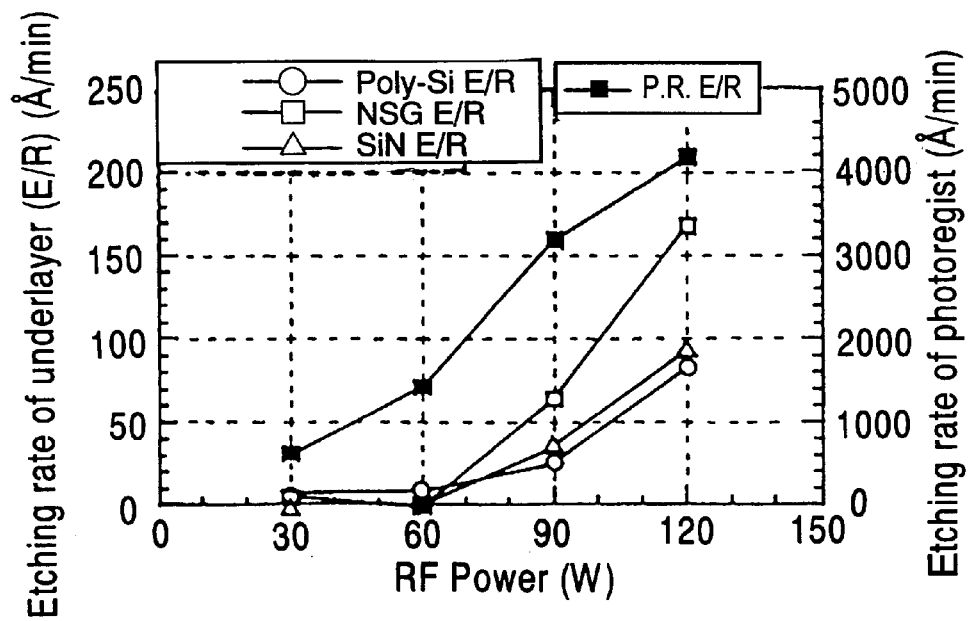
FIG. 5 is a graph illustrating the relationship between an RF power and an etching rate for an underlayer as well as an etching rate for a resist mask.
Figure 6A:
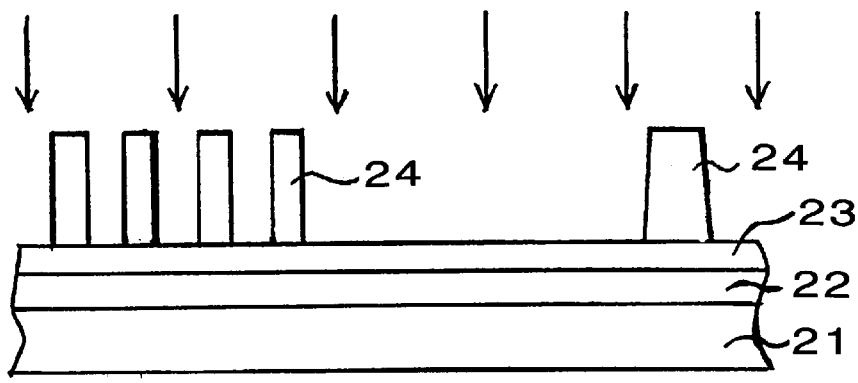
FIGS. 6(a) to 6(c) illustrate a conventional process for producing a semiconductor device.
Figure 6B:
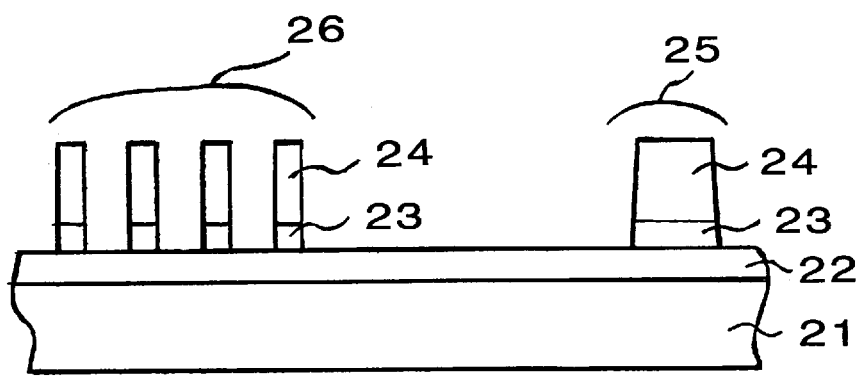
Figure 6C:
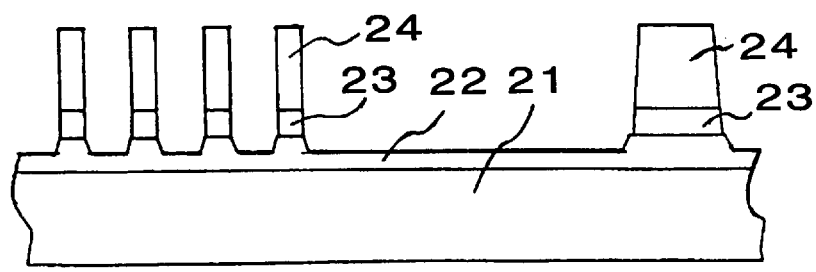

The dry etching can be carried out by ECR etching, ICP etching, TCP etching, RIE etching, $\mu$-wave etching, SWP etching, helicon wave etching and the like. In the case of the ECR etching, preferably, microwave power is about 100 to about 2000 W, RF bias power is 0 to about 1000 W and pressure is about 0.01 mtorr to about 100 mtorr. When the dry etching is carried out, the RF bias power is preferably kept at a low level as described above. FIG. 5 is a graph illustrating the relationship between the RF bias power and the etching rate of an underlayer (film to be etched) as well as the etching rate of the resist. FIG. 5 shows that the etching rate of the underlayer is reduced when the RF bias power is decreased. Especially in the case where the RF bias power is about 60 W or less, the etching rate of the underlayer can be reduced to about 10 Å or less. Thus controllability of the process is improved, that is, the underlayer can be prevented from being reduced in thickness due to over etching and it becomes possible to perform reworking after the etching. Further, if the RF bias power is kept low as described above, deformation of the pattern after the etching by etching effect can be prevented, so that a better configuration of the resist mask can be obtained.

The temperature that allows the deposition of a substance produced by reaction of chlorine and the material to be etched may be suitably adjusted for the kind of the organic antireflective film, as described above. For example, the temperature is preferably about −60 to about −10° C. in the case of carbon.

EMBODIMENT

The present invention will hereinafter be described in detail by way of an embodiment with reference to the accompanying drawings. The embodiment, however, should not be understood to limit the scope of the invention.

FIGS. 1(*a*) to 1(*h*) illustrate a process for producing a semiconductor device in accordance with an embodiment of the present invention. In FIG. 1, there are shown a silicon substrate 1, a gate oxide film 2, a LOCOS oxide film 3, a polysilicon film (film to be etched) 4, an ARC(an organic antireflective film) 5 containing carbon as a main component, a photo-resist 6, a resist mask 7 and an ARC pattern 8.

First, the gate oxide film 2 of 100 Å thickness and the LOCOS oxide film 3 of 3000 Å thickness were formed on the silicon substrate 1 by thermal oxidation (see FIG. 1(a)).

Figure 1B:
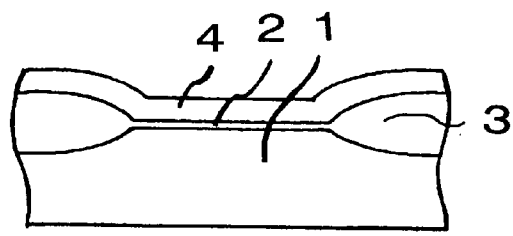

Then, the polysilicon film 4 of 1000 Å thickness was formed thereon by a CVD method (see FIG. 1(b)).

Figure 1C:
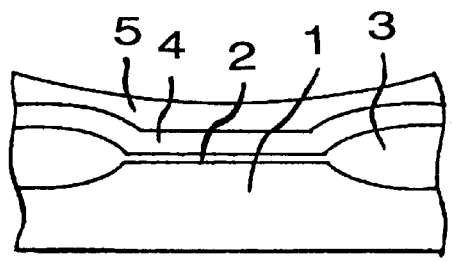

Then the ARC 5 of 1000 Å thickness was formed on the polysilicon film 4 by spin coating (see FIG. 1(c)).

Figure 1D:
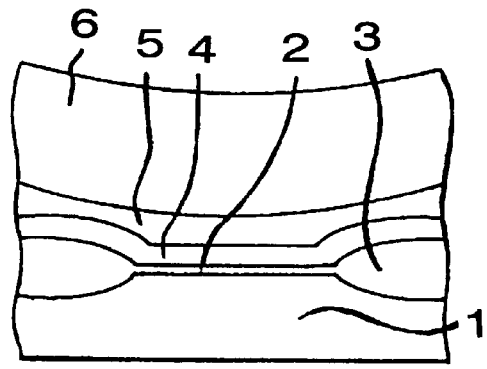
Figure 1E:
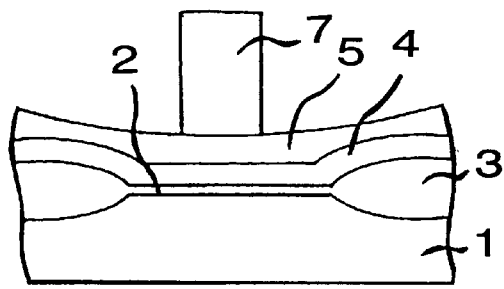
Figure 1F:
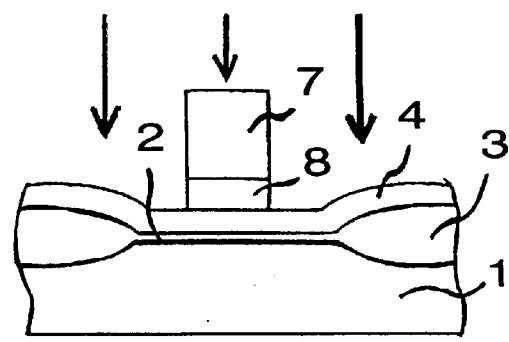
Figure 1G:
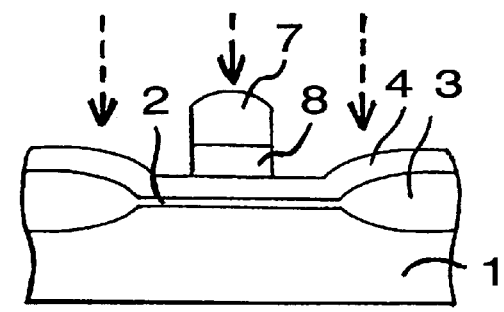
Figure 1H:
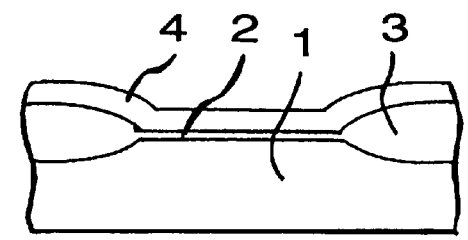

Subsequently, the photo-resist 6 was spin-coated onto the ARC 5 (see FIG. 1(d)). In this embodiment, a product "SWK (trade name)" manufactured by TOKYO OKA, Japan, was used as the ARC 5.

Then the resist mask 7 is formed by light-exposure and development. (see FIG. 1(e)).

The substrate 1 thus produced was put in an ECR etching apparatus and etched the ARC 5 with an etching gas of a mixture of oxygen gas ($O_2$) (at a flow rate of 12 sccm) and chlorine gas ($Cl_2$) (at a flow rate of 18 sccm) under a $\mu$-wave power of a 200 W, an RF power of 60 W and a pressure of 3 mtorr. The temperature of the substrate 1 was kept at a temperature such that CCl substances which was generated by the reaction of chlorine gas with the ARC or the resist do not sublime but deposit, for example, −35° C. The etching was a 30% over-etching. Thus the etched ARC pattern 8 was obtained (see FIG. 1(f)). During the ARC etching, the polysilicon film 4 was not over-etched.

Then, the polysilicon film 4 was etched under normal conditions using the resist mask 7. However, if any defect was found in the resist mask 7 at this stage, the substrate 1 was cleared of the resist mask 7 and the ARC pattern 8 by a 100% over ashing using a down-flow resist asher apparatus (FIG. 1(g)) so as to become ready for reworking (FIG. 1(h)). Here, the $\mu$-wave was 1000 W, an ashing gas was oxygen gas (at a flow rate of 5000 sccm), the pressure was 1.6 torr, and the temperature of the substrate was 230° C.

Then the resist mask was formed again (FIG. 1(c)) and the ARC was etched to produce a pattern without defects (not shown). The polysilicon film 4 was etched using the resist mask.

As described above in detail, the mixture gas of oxygen gas and chlorine gas or the mixture gas of oxygen- and chlorine-containing gases is used for etching the ARC. Here, the flow rate of chlorine gas is kept equal to or more than 30% with respect to the sum of the flow rate of chlorine gas and oxygen gas. The temperature of the substrate is maintained significantly low. Thus, it is possible to control the amount of deposits formed on the side walls of the pattern of resist mask and the amount of etching shift, independently of the density of the pattern.

The effect of the present invention can be obtained when the molar ratio of chlorine atom to chlorine atom and oxygen atom is 0.30 or more. However, when the molar ratio of the above exceeds 0.45, the dependence on the density of the pattern is not seen substantially, and the etching shift is further reduced.

Further by decreasing the RF power, the etching rate of the underlayer can be made distinctly different from that of the organic antireflective film. Thus the present invention contributes to improved controllability of the process and establishment of a reworking process.

What is claimed is:

1. A method for producing a semiconductor device comprising:

forming a film to be etched, an organic antireflective film and a resist mask on a substrate in this order; and before etching the film to be etched, dry-etching the organic antireflective film into a predetermined configuration by use of the resist mask and an etching gas containing chlorine atom and oxygen atom while maintaining the substrate at a temperature that allows deposition on the side walls of the resist mask of a substance produced by reaction of the organic antireflective film with chlorine atom contained in the etching gas.

2. A method according to claim 1, wherein, in the etching gas, a molar ratio of chlorine gas to a combination of chlorine gas and oxygen gas is at least about 0.3.

3. A method according to claim 1, wherein the substrate is maintained at a temperature of about −60 to about −10° C.

4. A method according to claim 1, wherein the dry etching is carried out by use of an ECR etching apparatus.

5. A method according to claim 4, wherein an RF power of the ECR etching apparatus is about 60 W or less.

6. A method according to claim 1, further including etching the film to be etched using the organic antireflective film as a mask after said dry-etching the organic antireflective film.

* * * * *